(12) United States Patent
Chiu et al.

(10) Patent No.: US 9,911,837 B2
(45) Date of Patent: Mar. 6, 2018

(54) HETEROJUNCTION BIPOLAR TRANSISTOR

(71) Applicant: WIN Semiconductor Corp., Taoyuan (TW)

(72) Inventors: Jui-Pin Chiu, Taoyuan (TW);
Shu-Hsiao Tsai, Taoyuan (TW);
Rong-Hao Syu, Taoyuan (TW);
Cheng-Kuo Lin, Taoyuan (TW)

(73) Assignee: Win Semiconductors Corp., Taoyuan (TW)

( * ) Notice: Subject to any disclaimer, the term of this patent is extended or adjusted under 35 U.S.C. 154(b) by 0 days.

(21) Appl. No.: 15/204,659

(22) Filed: Jul. 7, 2016

(65) Prior Publication Data

US 2016/0322482 A1   Nov. 3, 2016

Related U.S. Application Data

(62) Division of application No. 14/692,227, filed on Apr. 21, 2015, now abandoned.

(30) Foreign Application Priority Data

Jul. 16, 2014   (TW) .............................. 103124409 A
Jul. 18, 2014   (CN) .......................... 2014 1 0344152

(51) Int. Cl.
*H01L 29/06*   (2006.01)
*H01L 29/08*   (2006.01)
(Continued)

(52) U.S. Cl.
CPC ...... *H01L 29/7371* (2013.01); *H01L 29/0692* (2013.01); *H01L 29/0817* (2013.01); *H01L 29/1004* (2013.01); *H01L 29/41708* (2013.01)

(58) Field of Classification Search
CPC .......... H01L 29/7371; H01L 29/41708; H01L 29/0692; H01L 29/0817; H01L 29/1004;
(Continued)

(56) References Cited

U.S. PATENT DOCUMENTS

3,319,139 A * 5/1967 Rueffer ................... H01L 29/00
                                                             257/578
5,140,399 A * 8/1992 Kawai ................. H01L 29/7371
                                                             257/197
(Continued)

*Primary Examiner* — Galina Yushina
(74) *Attorney, Agent, or Firm* — Muncy, Geissler, Olds & Lowe, P.C.

(57) ABSTRACT

A heterojunction bipolar transistor, comprising an elongated base mesa, an "H" shaped emitter, two base electrodes, an elongated collector, and two elongated collector electrodes. The "H" shaped emitter is formed on the base mesa and has two parallel bars connected by a cross-bar. Two elongated emitter electrodes are formed respectively on the two parallel bars of the "H" shaped emitter. The "H" shaped emitter has two recesses respectively on two opposite sides of the cross-bar between the two parallel bars. The two base electrodes are formed on the base mesa respectively at the two recesses of the "H" shaped emitter, each of which has a base via hole near a center of the base mesa. The elongated collector is formed below the base mesa. The two elongated collector electrodes are formed on the collector respectively at two opposite sides of the base mesa.

6 Claims, 6 Drawing Sheets

(51) Int. Cl.
*H01L 29/737* (2006.01)
*H01L 29/417* (2006.01)
*H01L 29/10* (2006.01)

(58) Field of Classification Search
CPC ............ H01L 29/66242; H01L 29/737; H01L 29/66319; H01L 27/082; H01L 27/1022
See application file for complete search history.

(56) References Cited

U.S. PATENT DOCUMENTS

| | | | |
|---|---|---|---|
| 5,864,169 A * | 1/1999 | Shimura | ........... H01L 21/76898 257/197 |
| 2002/0024391 A1* | 2/2002 | Moriwaki | ......... H01L 29/41708 330/307 |
| 2006/0017065 A1 | 1/2006 | Kobayashi | |
| 2007/0012949 A1 | 1/2007 | Kawashima et al. | |

* cited by examiner

HETEROJUNCTION BIPOLAR TRANSISTOR

CROSS-REFERENCE TO RELATED DOCUMENTS

The present invention is a divisional application of U.S. patent application Ser. No. 14/692,227 entitled "Heterojunction Bipolar Transistor" filed on Apr. 21, 2015.

FIELD OF THE INVENTION

The present invention relates to a heterojunction bipolar transistor, and more particular to a heterojunction bipolar transistor has a high ratio of the emitter area to the base area, so that the power gain can be enhanced.

BACKGROUND OF THE INVENTION

In recent years, with the rapid development of mobile devices industry, the demand of high power, high power gain and high power added efficiency devices is also growing. The integrated circuits using compound semiconductor heterojunction bipolar transistors (HBTs) have been widely used in the power amplifier of mobile devices for their high power, high power gain, and high linearity. Therefore, by improving the layout design of the compound semiconductor HBT circuit, the power gain and power added efficiency of the HBT can be enhanced, and the competitiveness of the product containing the HBT can be increased.

The output power gain of an HBT is related to the base-collector junction capacitance, and the capacitance is proportional to the base area. The larger the ratio of the emitter area to the base area (EA/BA) is, the smaller the base-collector junction capacitance is. Therefore, by increasing the ratio of the emitter area to the base area, the base-collector junction capacitance can be effectively decreased, thereby enhancing the output power gain.

SUMMARY OF THE INVENTION

The main objective of the present invention is to provide a heterojunction bipolar transistor (HBT) having the following technical features:

1. a high ratio of the emitter area to the base area (EA/BA) to enhance the power gain of the HBT;
2. a lower collector resistance to improve the power added efficiency of the HBT;
3. a better emitter current distribution to improve the high power performance of the HBT.

To reach the objective stated above, the present invention provides a heterojunction bipolar transistor, which comprises an elongated base mesa, an elongated base electrode, two elongated emitters, an elongated collector, and two elongated collector electrodes, in which the elongated base mesa has a long axis and a short axis; the elongated base electrode has a long axis and a short axis and is formed on the base mesa with the long axis of the base electrode essentially parallel to the long axis of the base mesa, and the base electrode has a base via hole at or near the center of the base electrode; the two elongated emitters are formed on the base mesa respectively at two opposite sides of the base electrode along the long axis of the base electrode, and each emitter has an elongated emitter electrode formed on the emitter; the elongated collector is formed below the base mesa; and the two elongated collector electrodes are formed on the collector respectively at two opposite sides of the base mesa along the long axis of the base mesa.

Moreover, the present invention provides another heterojunction bipolar transistor, which comprises an elongated base mesa, an "H" shaped emitter, two base electrodes, an elongated collector, and two elongated collector electrodes, in which the elongated base mesa has a long axis and a short axis; the "H" shaped emitter is formed on the base mesa, the "H" shaped emitter has two parallel bars connected by a cross-bar, two elongated emitter electrodes are formed respectively on the two parallel bars of the "H" shaped emitter, and the "H" shaped emitter has two recesses respectively on two opposite sides of the cross-bar between the two parallel bars; the two base electrodes are formed on the base mesa respectively at the two recesses of the "H" shaped emitter, and each of the base electrode has a base via hole near a center of the base mesa; the elongated collector is fainted below the base mesa; and the two elongated collector electrodes are formed on the collector respectively at two opposite sides of the base mesa along the long axis of the base mesa.

In implementation, the base electrode is formed on the base mesa with the long axis of the base electrode essentially parallel to the long axis of the base mesa at or near the center of the short axis of base electrode.

In implementation, the base mesa having a length and a width, and the ratio of the length to width is between 1.2:1 and 15:1.

In implementation, the base mesa, the emitter electrodes, and the collector electrodes are in rectangular shapes.

In implementation, recesses of the "H" shaped emitter are provided at or near the center of the short axis of the base mesa.

In implementation, the base mesa, the emitters, and the collector are in bent elongated shapes each having a bending position, and the bending position located at or near the center of the elongated shape.

In implementation, the base mesa, the emitters, and the collector are in bent elongated shapes each having a bending position, and the bending position located at or near the center of the elongated shape with a bending angle of 90°.

The present invention will be understood more fully by reference to the detailed description of the drawings and the preferred embodiments below.

DETAILED DESCRIPTIONS OF PREFERRED EMBODIMENTS

FIGS. 1A, 1B, 2A, and 2B are embodiments of an I type heterojunction bipolar transistor (HBT) provided by the present invention, which comprises a rectangular base mesa 110, a rectangular base electrode 111, two rectangular emitters 120a and 120b, a rectangular collector 130, and two rectangular collector electrodes 131a and 131b, in which the rectangular base mesa 110 has a long axis along the y direction and a short axis along the x direction; the rectangular base electrode 111 has a long axis and a short axis and is formed on the base mesa 110 with the long axis of the base electrode 111 essentially parallel to the long axis of the base mesa 110, and the base electrode 111 has a base via hole 112 at or near the center of the base electrode 111; the two rectangular emitters 120a and 120b are formed on the base mesa 110 respectively at two opposite sides of the base electrode 111 along the long axis of the base electrode 111, and emitters 120a and 120b have rectangular emitter electrodes 121a and 121b formed on emitters 120a and 120b, respectively; the rectangular collector 130 is formed below the base mesa 110; and the two rectangular collector electrodes 131a and 131b are formed on the collector 130 respectively at two opposite sides of the base mesa 110 along the long axis of the base mesa 110.

In an embodiment, the abovementioned base electrode 111, emitter electrodes 121a and 121b, and collector electrodes 131a and 131b are electrically connected to the metal conduction lines (140a-140e) formed by a first metal layer, and further electrically connected to the metal conduction line 150 formed by a second metal layer through the first metal layer. Through the connection of the first or the second metal layers to other electronic devices, a requested circuit is constructed. The portion of the I type HBT 100 that does not electrically connected to the first metal layer is isolated by one or more protection layers (e.g. 160a), and the portion of the first metal layer that does not electrically connected to the second metal layer is isolated by at least one protection layer (e.g. 160b, 160c). The material forming the protective layer must be electrically insulating, and must be able to prevent the materials of the metal layers or other structure diffusing into the HBT. In the present embodiment, the one or more protective layers can be formed of materials of good isolation property, such as silicon nitride (SiN), polyimide, etc.

The resistance between the collector and emitter ($R_{CE}$) is related to the adjacent periphery between the collector electrode and emitter. The longer the adjacent periphery between the collector and emitter is, the lower the $R_{CE}$ is. In the HBT provided by the present invention, the design of the collectors located on two sides of the emitter increases the adjacent periphery between the collector and emitter, thereby reducing the collector resistance $R_{CE}$ and improving the power added efficiency of the HBT. In addition, in the design provided by the present invention, the transistor receives the input signal via the first metal layer through the base via hole. Since the base via hole is located at the center of the transistor, the distribution of the emitter current is symmetric or nearly symmetric, and therefore the high power performance of the HBT can be enhanced.

In the present embodiment, to increase the ratio of the emitter area to the base area (EA/BA), the ratio of the length to width of the emitter and the base mesa should be increased. However, the emitter area will be increased as well, leading to a higher thermal resistance of the transistor. In order to achieve the largest ratio of the emitter area to the base area (EA/BA) and to keep the thermal resistance in a lower value, the ratio of the length to width of the rectangular base mesa may be any value between 1.2:1 and 15:1, such as 2:1, 3:1, 4:1, 5:1, 6:1, 7:1, 8:1, 9:1, 10:1, 11:1, 12:1, 13:1, 14:1 or 15:1, in which the ratio between 1.2:1 to 10:1 is preferred, 1.5:1 to 8:1 is more preferred, and 2:1 to 7:1 is most preferred.

Figure 4:
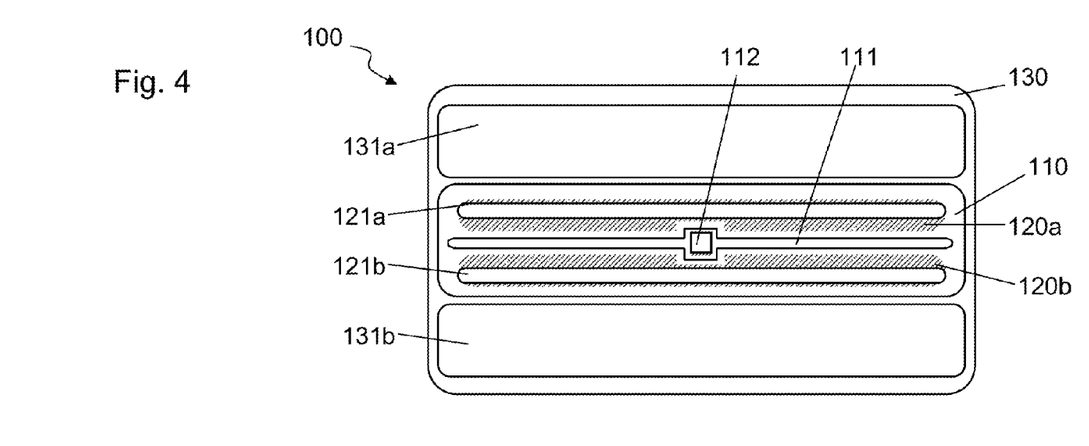
FIGS. 4, 5, and 6 are top views of embodiments of a heterojunction bipolar transistor provided by the present invention.

The aforementioned base, emitter, and collector and the base electrode, emitter electrode, and collector electrode provided thereon respectively may also be in any other elongated shapes, such as an oblong, as long as the long axes of the elongated base, emitter, and collector and their electrodes remain parallel to each other, as shown in FIG. 4.

Figure 6:
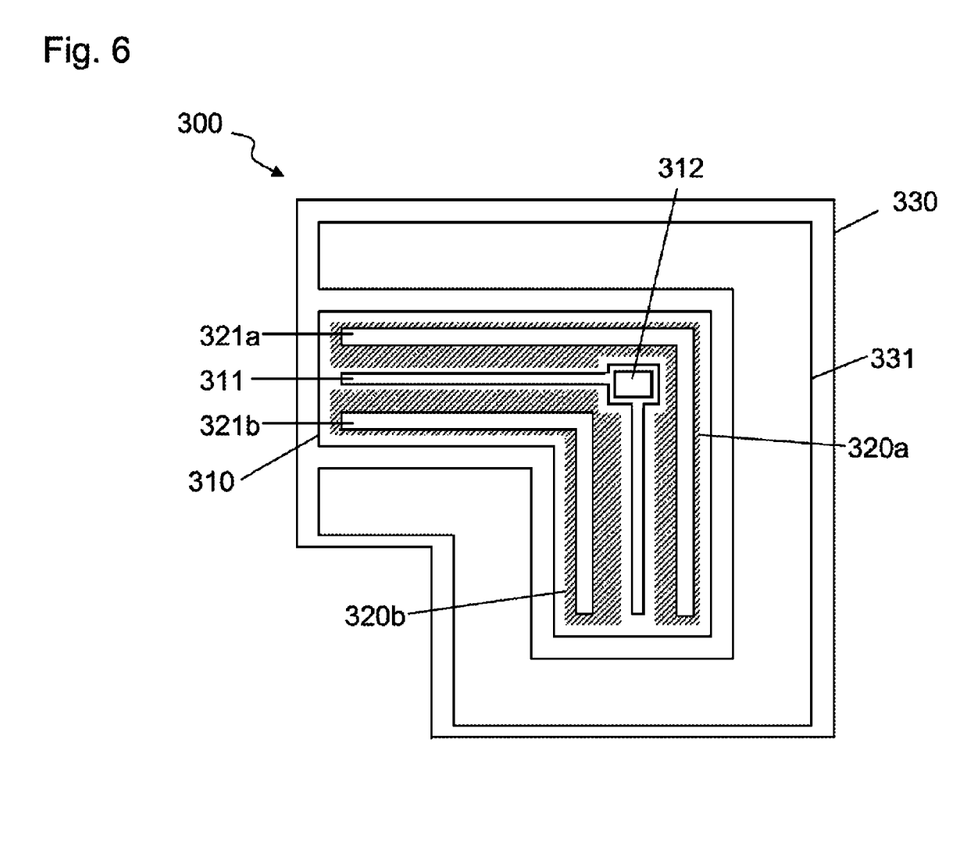

The aforementioned base, emitter, and collector and the base electrode, emitter electrode, and collector electrode provided thereon respectively may also be in a bent elongated shape, which may have one or more bending positions. FIG. 6 shows an embodiment of an "L" shape HBT 300 with one bending position, in which the base mesa 310, two emitters 320a and 320b, and the collector 330 are all in "L" shapes. The bending angle at the bending position may be in a range greater than 0° and less than 180°. In the embodiment shown in FIG. 6, the bending angle of the "L" shape is about 90°.

Figure 1A:
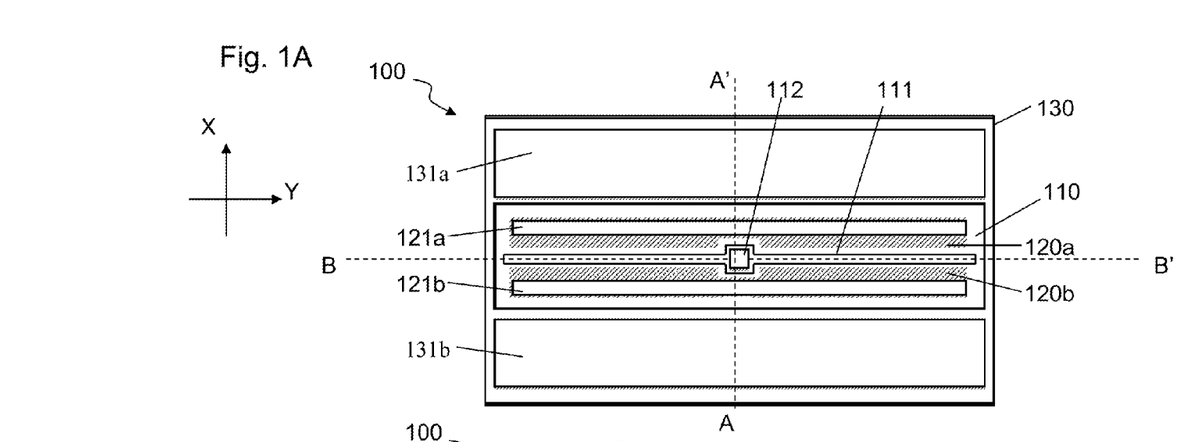
FIGS. 1A and 1B are top views of an embodiment of a heterojunction bipolar transistor provided by the present invention.
Figure 1B:
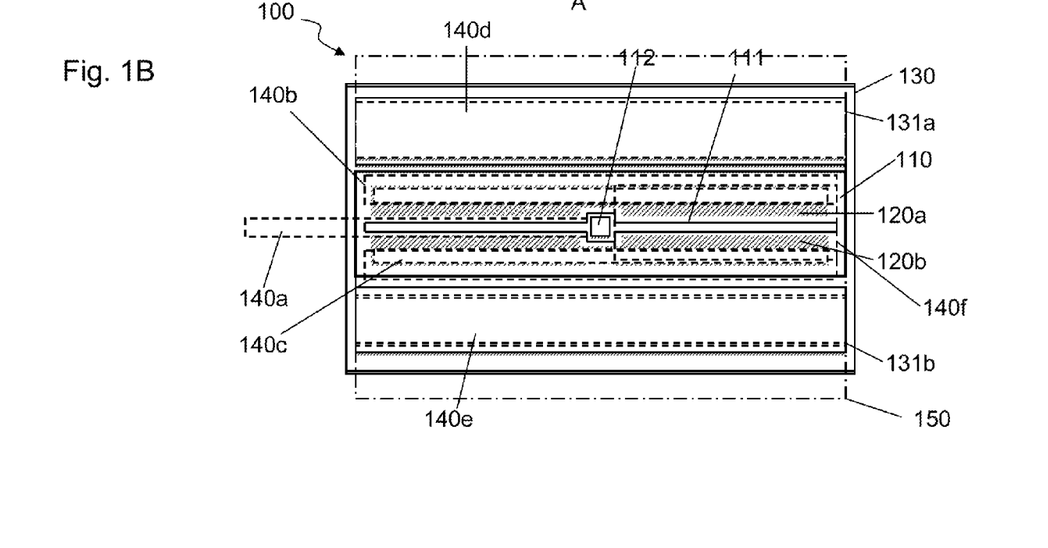
Figure 2A:
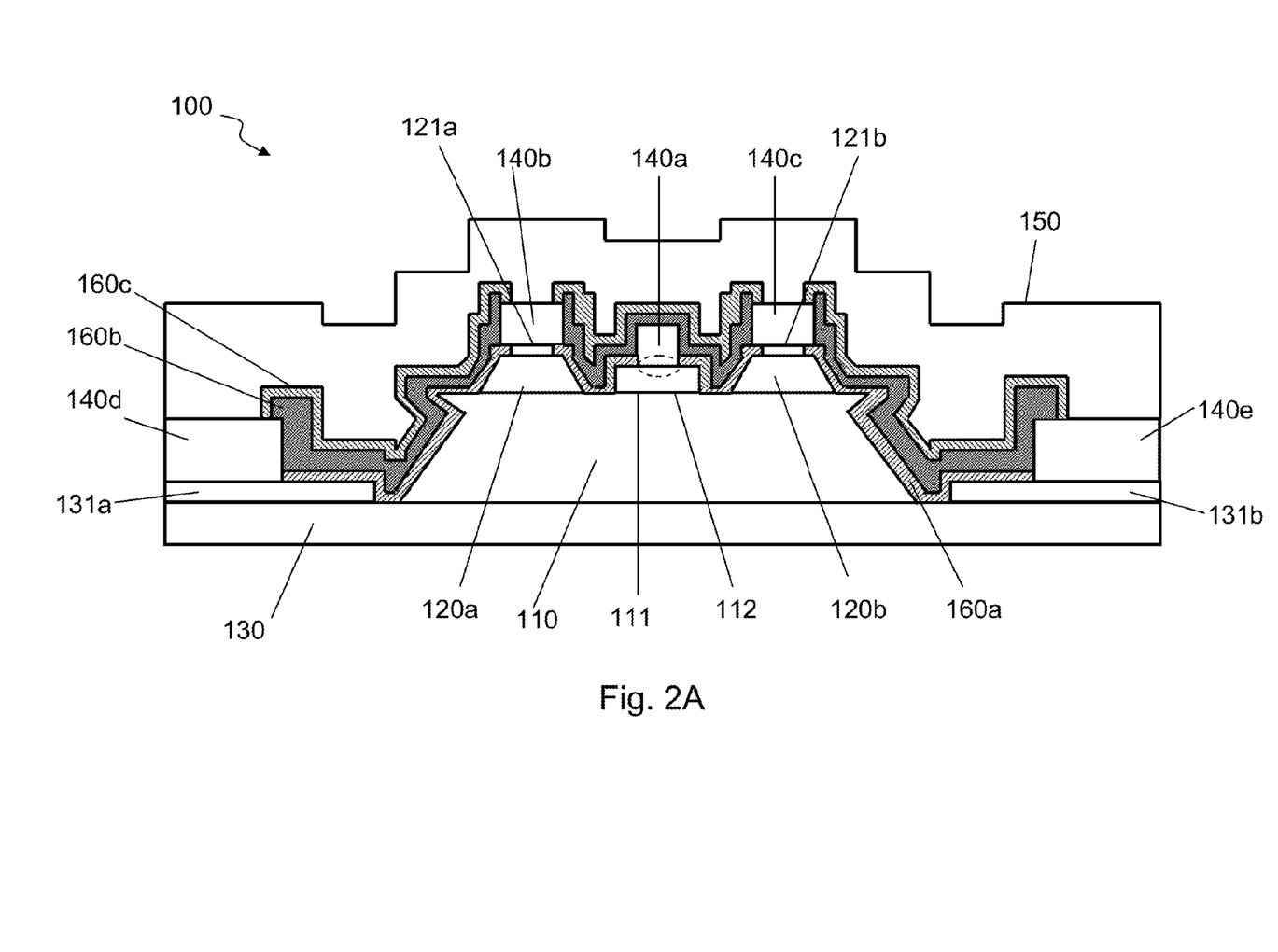
FIGS. 2A and 2B are cross-sectional views of an embodiment of a heterojunction bipolar transistor provided by the present invention along the line A-A' and line B-B' in FIG. 1A, respectively.
Figure 2B:
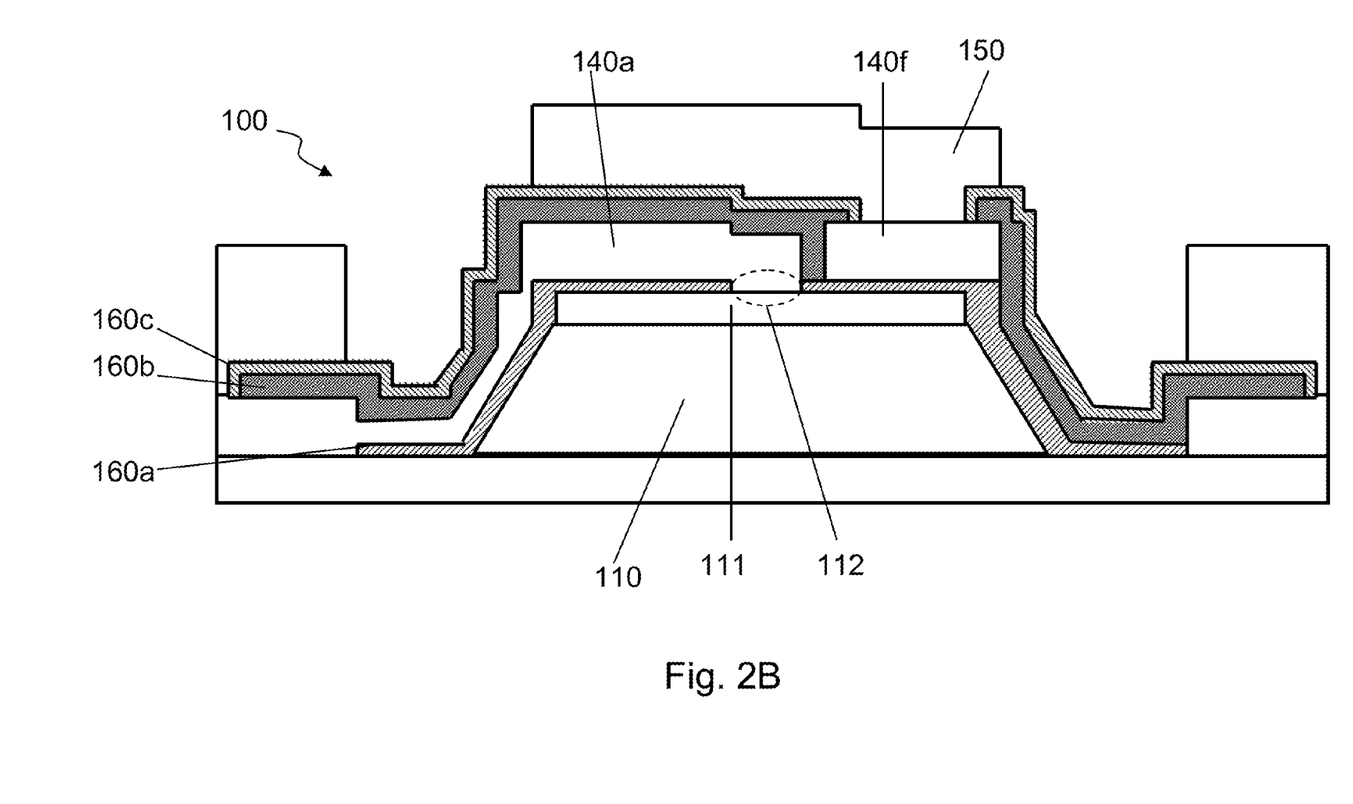
Figure 3A:
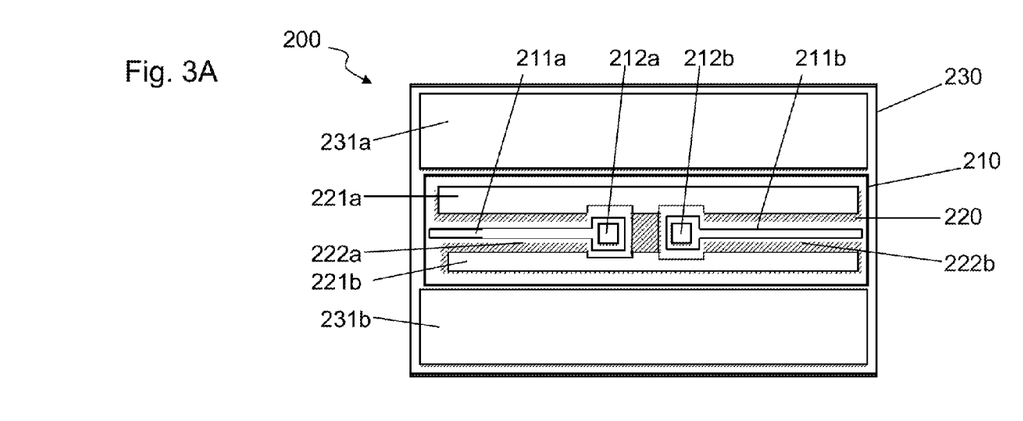
FIGS. 3A and 3B are top views of another embodiment of a heterojunction bipolar transistor provided by the present invention.
Figure 3B:
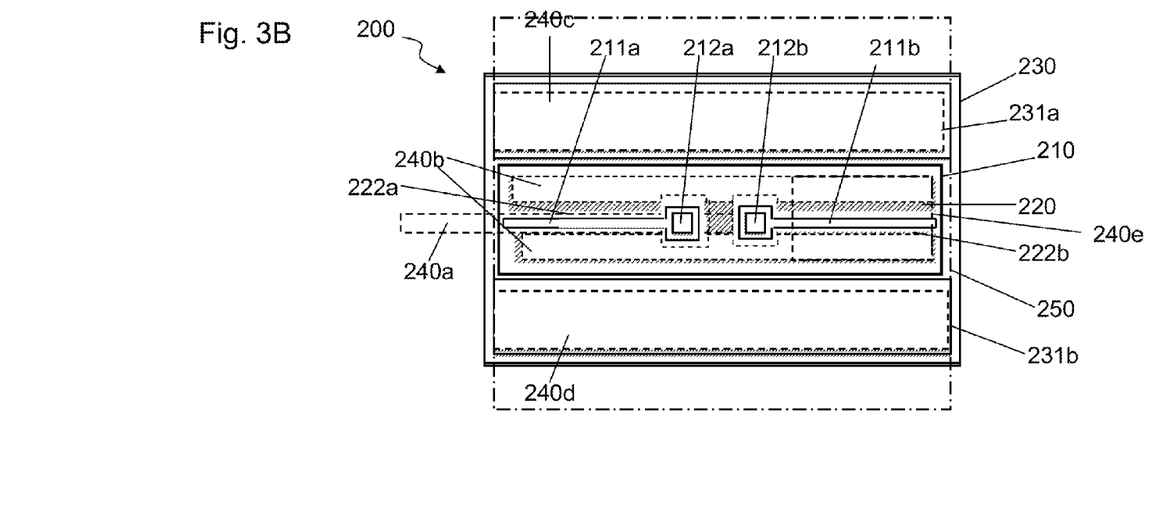

FIGS. 3A and 3B are top views showing embodiments of an H type HBT 200 provided by the present invention, which comprises an rectangular base mesa 210, an "H" shaped emitter 220, two base electrodes 211a and 211b, an rectangular collector 230, and two rectangular collector electrodes 231a and 231b, in which the rectangular base mesa 210 has a long axis and a short axis; the "H" shaped emitter 220 is formed on the base mesa 210, and the "H" shaped emitter 220 has two recesses 222a and 222b respectively on two opposite sides of the "H" shape, and the emitter 220 has two elongated emitter electrodes 221a and 221b formed on the "H" shaped emitter 220; the two base electrodes 211a and 211b are formed on the base mesa 210 respectively at the two recesses 222a and 222b of the "H" shaped emitter 220, and each of the base electrode 211a and 211b has a base via hole (212a and 212b) near the center along the long axis of the base mesa 210; the rectangular collector 230 is formed below the base mesa 210; and the two rectangular collector electrodes 231a and 231b are formed on the collector 230 respectively at two opposite sides of the base mesa 210 along the long axis of the base mesa 210.

In an embodiment, the abovementioned base electrode 211a and 211b, emitter electrodes 221, and collector electrodes 231a and 231b are electrically connected to the metal conduction lines (240a-240d) formed by a first metal layer, and further electrically connected to the metal conduction line 250 formed by a second metal layer through the first metal layer. Through the connection of the first or the second metal layers to other electronic devices, a requested circuit is constructed. The portion of the H type HBT 200 that does not electrically connected to the first metal layer is isolated by one or more protection layers, and the portion of the first metal layer that does not electrically connected to the second metal layer is isolated by at least one protection layer. The material forming the protective layer must be electrically insulating, and must be able to prevent the materials of the metal layers or other structure diffusing into the HBT. In the present embodiment, the one or more protective layers may be formed of materials of good isolation property, such as silicon nitride (SiN), polyimide, etc.

In the present embodiment, in order to achieve the largest ratio of the emitter area to the base area (EA/BA) and to keep the thermal resistance in a lower value, the ratio of the length to width of the rectangular base mesa may be any value between 1.2:1 and 15:1, such as 2:1, 3:1, 4:1, 5:1, 6:1, 7:1, 8:1, 9:1, 10:1, 11:1, 12:1, 13:1, 14:1 or 15:1, in which the ratio between 1.2:1 to 10:1 is preferred, 1.5:1 to 8:1 is more preferred, and 2:1 to 7:1 is most preferred.

Figure 5:
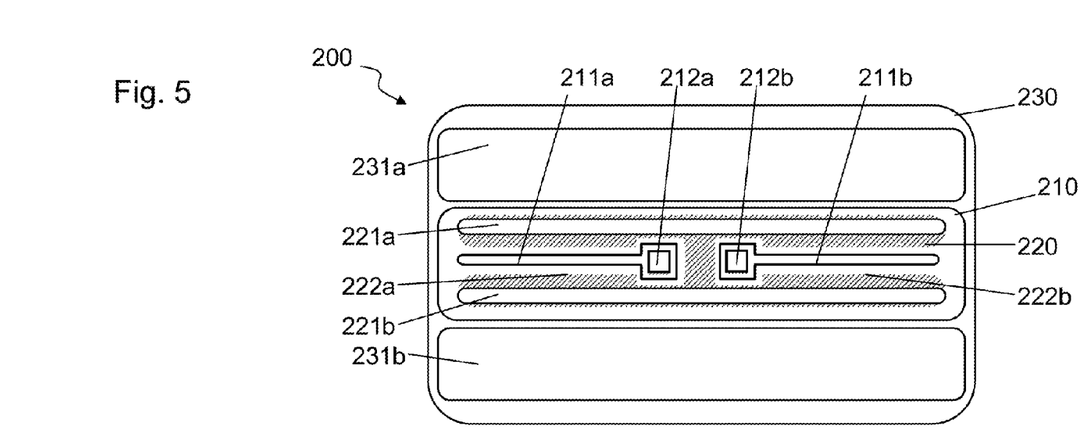

The aforementioned base, emitter, and collector and the base electrode, emitter electrode, and collector electrode provided thereon respectively may also be in any other elongated shapes, such as an oblong, as long as the long axes of the elongated base, emitter, and collector and their electrodes remain parallel to each other, as shown in FIG. 5.

The present invention has the following advantages:

1. The elongated HBT provided by the present invention has a higher ratio of the emitter area to the base area (EA/BA), thus leading an enhanced power gain of the HBT.

2. The design of disposing the collector at two opposite sides of the emitter can extend the adjacent periphery between the collector and the emitter, and the design of elongated collector and emitter further extend the adjacent periphery. A lower resistance between the collector and emitter $R_{CE}$ can thus be reached, which improve the power added efficiency of the HBT.

3. The emitter current distribution is symmetric or nearly symmetric, and therefore the high power performance of the HBT can be enhanced.

To sum up, the HBT provided by the present invention can indeed meet its anticipated objective to provide higher ratio of the emitter area to the base area, so that the power gain of the HBT can be enhanced. Moreover, the HBT provided by the present invention has a lower resistance between the collector and emitter, so that the power added efficiency of the HBT is improved, which is the major demand of the performance of a HBT in the fabrication of a power amplifier.

The description referred to in the drawings and stated above is only for the preferred embodiments of the present invention. Many equivalent local variations and modifications can still be made by those skilled at the field related with the present invention and do not depart from the spirit of the present invention, so they should be regarded to fall into the scope defined by the appended claims.

What is claimed is:

1. A heterojunction bipolar transistor, comprising:
    an elongated base mesa having a long axis and a short axis;
        an "H" shaped emitter formed on the base mesa, the "H" shaped emitter having two parallel bars connected by a cross-bar, two elongated emitter electrodes formed respectively on the two parallel bars of the "H" shaped emitter, and the "H" shaped emitter having two recesses respectively on two opposite sides of the cross-bar between the two parallel bars;
    two base electrodes formed on the base mesa respectively at the two recesses of the "H" shaped emitter, and each of the base electrodes having a base via hole near a center along the long axis of the base mesa;
    an elongated collector formed below the base mesa; and
    two elongated collector electrodes formed on the collector respectively at two opposite sides of the base mesa along the long axis of the base mesa.

2. The heterojunction bipolar transistor according to claim 1, wherein the recesses of the "H" shaped emitter are provided at or near a center of the short axis of the base mesa.

3. The heterojunction bipolar transistor according to claim 2, wherein the base mesa, the emitter electrodes, and the collector electrodes are in rectangular shapes.

4. The heterojunction bipolar transistor according to claim 1, wherein the base mesa having a length and a width, and a ratio of the length to width is between 4:1 and 15:1.

5. The heterojunction bipolar transistor according to claim 4, wherein the base mesa, the emitter electrodes, and the collector electrodes are in rectangular shapes.

6. The heterojunction bipolar transistor according to claim 1, wherein the base mesa, the emitter electrodes, and the collector electrodes are in rectangular shapes.

* * * * *